(12) United States Patent
Brown et al.

(10) Patent No.: US 7,280,456 B2
(45) Date of Patent: Oct. 9, 2007

(54) METHODS AND APPARATUS FOR DETERMINING THE STATE OF A VARIABLE RESISTIVE LAYER IN A MATERIAL STACK

(75) Inventors: Michael A. Brown, Phoenix, AZ (US); Luke A. Johnson, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 639 days.

(21) Appl. No.: 10/628,526

(22) Filed: Jul. 28, 2003

(65) Prior Publication Data

US 2005/0023460 A1 Feb. 3, 2005

(51) Int. Cl.
*G11B 7/00* (2006.01)
(52) U.S. Cl. .................... 369/101; 369/126; 369/275.2
(58) Field of Classification Search ............... 369/126, 369/101, 275.2; 360/31, 110, 113, 324.2; 257/529; 250/306; 324/126, 130; 365/158, 365/173; 428/611
See application file for complete search history.

(56) References Cited

U.S. PATENT DOCUMENTS

| | | | | |
|---|---|---|---|---|
| 3,750,117 A | | 7/1973 | Chen et al. | |
| 5,293,781 A | * | 3/1994 | Kaiser et al. | 250/306 |
| 5,473,244 A | * | 12/1995 | Libove et al. | 324/126 |
| 5,982,568 A | * | 11/1999 | Yamamoto et al. | 360/31 |
| 6,147,395 A | * | 11/2000 | Gilgen | 257/529 |
| 6,473,388 B1 | * | 10/2002 | Gibson | 369/126 |
| 6,507,552 B2 | | 1/2003 | Gibson | |

* cited by examiner

*Primary Examiner*—Andrea Wellington
*Assistant Examiner*—Kim-Kwok Chu
(74) *Attorney, Agent, or Firm*—Marshall, Gerstein & Borun LLP (57) ABSTRACT

A method and an apparatus for detecting a number of variation in resistance within a material stack in response to a scanning and injection of a non-contacting electron stream into a material stack, the material stack having a first conductive contact layer, a variable resistive layer, a fixed resistive layer, and a second conductive contact layer, and the variations in resistance within the material stack being based on one of a plurality of resistive states of the variable resistive layer. The method also includes generating two magnetic fields within a transformer, the transformer being operatively coupled to the first and second conductive contact layers and generating a differential output signal within the transformer based on the two magnetic fields, the differential output signal being associated with one of the plurality of resistive states.

28 Claims, 7 Drawing Sheets

METHODS AND APPARATUS FOR DETERMINING THE STATE OF A VARIABLE RESISTIVE LAYER IN A MATERIAL STACK

TECHNICAL FIELD

The present disclosure relates to data storage medium, and more particularly, to a remotely located, non-contacting method and apparatus for determining a state of a variable resistive layer within a material stack.

BACKGROUND

Today, many forms of medium are used to store data. Examples of data storage medium include a compact disc (CD) such as CD read-only memory (CD-ROM), CD recordable (CD-R), CD rewritable (CD-RW) and CD read only memory (CD-ROM), and a digital versatile disc (DVD) such as DVD read-only-memory (DVD-ROM), DVD random-access-memory (DVD-RAM) and DVD read-write (DVD-RW). Typically, a laser beam is used to write on and to read a material stack of these data storage mediums. Information may be stored in a sequential, planar fashion in these material stacks. Existing technologies utilize an outward spiraling, sequentially ordered stream of data blocks written or molded onto the top of the lands or the bottom of the grooves of the media. In many of these applications, the medium of choice is a chalcogenide, phase-change media where the information content is written as a sequence of varying length or position dependant spots where the reflectance of the media reflects the written states of the medium.

The material stack may include a thin-film of material such as a phase-change chalcogenide alloy material to store information or material with similar variable resistance properties that indicates the states of the material as it was written. In particular, a low-energy electron stream may be used to change the state of the phase-change material, amorphous or crystalline, to write information in the data storage medium. To recover the information from the data storage medium, a low-energy, lower current electron stream may be used to sense the resistance of the phase-change material. The voltage required to project a small diameter spot of electrons in the form of a focused beam, e-beam, is in the range of 100 to 100,000 volts.

However, non-contact sensing of the resistance state of a region of phase-change material in the presence of voltages greater than a few volts, typically greater than 10-volts, might require circuit isolation and this is typically accomplished at significantly increased expense. To sense small variations in the resistance at these anode voltages, and at low currents with current low-voltage silicon circuits such as a complementary metal-oxide semiconductor (CMOS) can be difficult and expensive.

Therefore, a need exists for a robust, non-contact, low-cost means to determine a resistance state of a rapidly sensed sequence of phase-change material regions in a data storage layer within a material stack.

BRIEF DESCRIPTION OF THE DRAWINGS

This disclosure will describe several embodiments to illustrate its broad teachings. Reference is also made to the attached drawings.

DETAILED DESCRIPTION

A method and an apparatus for determining a state of a variable resistive layer in a material stack of a data storage medium are described. The material stack may be configured to store information. In particular, the material stack, when observed from the electron-beam incident facet, may include a first conductive contact layer or passivated conductive layer, a variable resistive data storage layer, a fixed resistive reference layer, and a second conductive contact layer.

The order of the variable resistive layer and the fixed resistive layer may be reversed if the electron-beam energy is sufficiently high such that a significant number of electrons from the beam reach the variable resistive layer before loosing enough energy to reach the fermi level. The first conductive contact layer may overlie the variable resistive layer, which in turn, may overlie the fixed resistive layer. The variable resistive layer may be a phase-change, chalcogenide alloy material. In an alternative embodiment, the fixed resistive layer may be a portion of the variable resistive layer that has a fixed phase that is not significantly altered by subsequent changes in the variable resistance data storage layer. Underlying the fixed resistive layer is the second conductive contact layer. The material stack may include a substrate layer, which may be configured to serve as the second conductive contact layer. Alternatively, the second conductive contact layer may be a portion of the substrate layer.

To simplify the description in this patent, the following descriptions will be based on one simplified variation having the following material stack when viewed from the electron-beam injection facet: 1) a conductive-contact layer; 2) a variable resistance data storage layer; 3) a fixed resistance reference layer and 4) a second conductive-contact layer. Additionally, between each or some of these layers, interfacial materials, buffers, may be inserted to perform lattice or material matching to improve or enhance electron conduction across these boundaries.

A transformer may be operatively coupled to the material stack via the first and second conductive contact layers. The windings of the transformer may be configured to sense a difference in current distribution in the material stack in response to an injection of an electron stream as described in detail below. The transformer may include a first winding, a second winding, and a third winding. In particular, the first winding may be operatively coupled to the first conductive contact layer, and the second winding may be operatively coupled to the second conductive contact layer. To optimize the performance of common-mode rejection of the anode voltage variations for the transformer, the first and second windings may have an identical number of turns or a turns-ratio to match the ratio of the impedances seen by the anode voltage through each of the conductive contact layers. Alternatively, the transformer may be a "center-tapped"

transformer such that the anode voltage is connected to the "center-tap" and the ends of this winding are connected to each conductive contact layer. The "center-tap" ratio could be optimized in the same manner as previously described. Alternatively, if the current variation of a single conductive layer is sufficient, the second winding may be operatively coupled between an equivalent circuit of the contact layer and material stack back to the potential of the energy source and the anode voltage to provide a reduced level of common-mode rejection of the anode voltage variations. Alternatively, if the current variation of a single conductive layer is sufficient, the second winding may be operatively disconnected, removed or coupled to both contacts of an equivalent circuit of the contact layer and material stack thus providing minimum levels of common-mode rejection of the anode voltage variations.

An energy source may inject the electron stream into the material stack including the variable resistive layer through the first conductive contact layer. Electrons from the electron stream will scatter within the material stack, with a significant number of electrons scattering in the variable resistive layer. An anode power supply operatively coupled to the transformer may provide anode voltages to the first and second conductive contact layers of the material stack via the first and second windings, respectively. Accordingly, the electrons are attracted to the anode voltages in the first and second conductive contact layers. Based on the resistance of the variable resistive layer, the electrons will be distributed towards both the first conductive contact layer and the second conductive contact layer. For example, the majority of the electrons will flow toward the first conductive contact layer if the variable resistive layer is in a low resistive state (i.e., the variable resistive layer is in the lower resistance state, then this state can be arbitrarily assigned a logical value of zero). In contrast, more electrons may flow toward the second conductive contact layer if the variable resistive layer is in a high resistive state (i.e., the variable resistive layer is in the higher resistance state, then this state can be arbitrarily assigned a logical value of one).

Based on the distribution of the electrons, the transformer will create a difference potential in the third winding of the transformer. The difference potential in the third winding will be proportional to the rate of change in the distribution of scattered electrons from the injection source. In normal operation, the electron-beam is operated in a scanning mode where a succession of cells of differing values are sequentially illuminated by the electron-beam thus creating a series of values representative of the resistive states in the phase-change data storage layer. In response to the differential magnetic field, the third winding generates an output signal so that the information stored on the material stack may be recovered.

Figure 1:
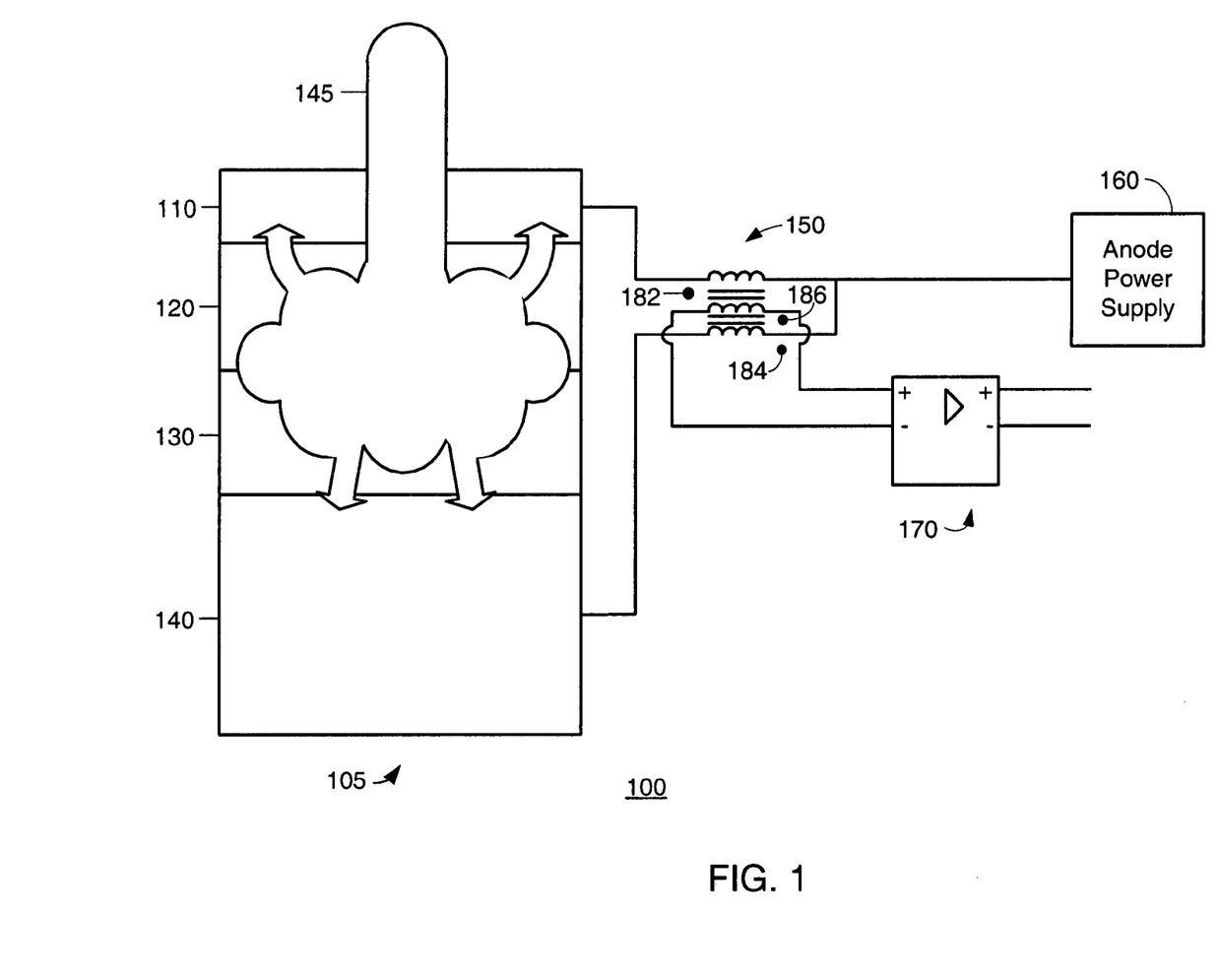
FIGS. 1, 2 and 3 are block diagram representations of systems for determining a state of a variable resistive layer in a material stack.

Referring to FIG. 1, a material stack 105 of a data storage medium generally includes a conductive contact layer 110, a variable resistive layer 120 (e.g., a data storage layer), a fixed resistive layer 130, and a substrate layer 140. The conductive contact layer 110 is disposed on top of the variable resistive layer 120. The conductive contact layer 110 may be, but is not limited to, an aluminum or titanium alloy material. The variable resistive layer 120 may be, but is not limited to, a phase-change, chalcogenide alloy material of the binary, ternary or quaternary classes similar to but not limited to InSe, GeSbTe and AgInSbTe. For example, the variable resistive layer 120 may be either a read-only-memory (ROM) structure made with a pre-programmmed resistance material a write-once-memory made with a single-cycle, writable material or a re-writable memory structure made with a phase-change or other multiple write cycle programmable resistance materials. The variable resistive layer 120 may include, but is not limited to, two resistive states: (1) a low resistance state (i.e., zeroes), and (2) a high resistance state (i.e., ones) or any discernable discrete number of states that can be reliably written, detected, decoded and corrected by means and methods familiar to those practitioners familiar with the arts of information storage in optical and magnetic media.

Below the variable resistive layer 120 is the fixed resistive layer 130, which is configured to provide a fixed value of resistance relative to the resistive states of the variable resistive layer 120 mentioned above. The fixed resistive layer 130 may be, but is not limited to, a resistive material, a non-linear semiconductor (e.g., a diode), and a band gap material. The fixed resistive layer 130 may be sensitive to the effects of a voltage drop generated as electrons are conducted through the resistance path of the variable resistive layer 120 to the conductive contact layer 110.

Based on the energy of an electron stream injected into the material stack 105 as described in detail below, the fixed resistive layer 130 may overlie the variable resistive layer 120. For example, a low-energy electron stream 145 may be used to inject electrons through only the conductive contact layer 110 before interacting with the variable resistive layer 120. In contrast, a higher energy electron stream may be used to inject electrons through both the conductive contact layer 110 and the fixed resistive layer 130 before interacting with the variable resistive layer 120 (i.e., the electron stream is configured to a current density level sufficient to read information stored on the material stack but not to write to the material stack).

Without the fixed resistive layer 130, the electrons injected into the material stack 105 may scatter within the variable resistive layer 120 and distribute evenly based on the average electron penetration depth toward the top conductive contact layer 110 and the second conductive, substrate layer 140 (i.e., no change in current within the material stack 105). Although the variable resistive layer 120 and the fixed resistive layer 130 are shown as separate layers in the material stack 105, the variable resistive layer 120 and the fixed resistive layer 130 may be a single layer in the material stack 105. That is, the fixed resistive layer 130 may be a portion of the variable resistive layer 120 where the resistance remains constant through subsequent data write cycles.

Underlying the fixed resistance layer 130 is the substrate layer 140, which may be configured to operate as a second conductive contact layer while the conductive contact layer 110 serves as a first conductive contact layer. The substrate layer 140 may be a conductive material, i.e. a doped silicon wafer or other conductive material, to attract electrons scattered within the variable resistive layer 120. To optimize performance, the variable resistive layer 120 may be relatively thinner than the diameter of the electron stream 145 injected into the material stack 105.

The sheet resistance of the conductive contact layer 110 should be significantly lower than the sheet resistance of the variable resistive layer 120 in a low resistance state to maximize the phase-change spot detection resolution thus minimizing the detectable spot size and maximizing data storage density and capacity. The sheet resistance of the substrate layer 140 shown in FIG. 1 should also be significantly lower than the sheet resistance of the variable resistive layer 120 in the low resistance state and the sheet resistance of the fixed resistance reference layer. Accordingly, the electrons from the electron stream 145 injected into the material stack 105 may flow to either the conductive contact layer 110 or the substrate layer 140.

A transformer 150 may be operatively coupled to the material stack 105, an anode power supply 160, and an amplifying circuit 170. In particular, the transformer 150 may be operatively coupled to the conductive contact layer 110 and the substrate layer 140. The transformer 150 may be configured to isolate electrically the read channel signal of the material stack 105 from electrical components such as the common-mode noise of the anode power supply 160 and the amplifying circuit 170. Further, the transformer 150 may be configured to isolate the anode voltage from the material stack 105 to an operable voltage level that the electrical components such as the amplifying circuit 170 may amplify and detect. The anode power supply 160 may be configured to provide anode voltages to the conductive contact layer 110 and the substrate layer 140 via the transformer 150 to attract electrons scattered within the material stack and variable resistive layer 120 as described in detail below.

A basic electron flow for determining a state of the variable resistive layer 120 that may be applied to the material stack 105 shown in FIG. 1 may start with an energy source (not shown) injecting the stream of electrons 145 into the variable resistive layer 120 of the material stack 105. The remotely located, non-contacting electron source may be, but is not limited to, a scanning-tunneling-microscopy tip, a cold cathode, a hot cathode, and a field emitter. For example, the electron stream 145 is injected with sufficient energy to pass most of the electrons through the conductive contact layer 110.

The electron source may be configured to generate the electron stream 145 with a relatively controlled diameter, energy level, and electron density distribution across the major and minor diameters of the stream 145. The conductive contact layer 110 and the substrate layer 140 may be biased to the same voltage level (i.e., a voltage to attract electrons from the energy source). The conductive contact layer 110 and the substrate layer 140 may be biased to the different voltage levels to optimize the differential electron distribution of the stream 145. That is, the conductive contact layer 110 and the substrate layer 140 may be biased to a voltage in a range of 100 to 100,000 volts by the anode power supply 160.

The electrons may scatter within all of the layers, with a significant number of the electrons scattering in the variable resistive layer 120. Based on the path resistance of the electrons, the electrons may flow to either the conductive contact layer 110 or the substrate layer 140 to reach the anode voltages of the anode power supply 160. For example, more electrons may flow toward the conductive contact layer 110 if the variable resistive layer 120 is in a low resistance state (i.e., zeroes) whereas more of the electrons will flow toward the substrate layer 140 if the variable resistive layer 120 is in a high resistance state (i.e., ones).

In the variable resistive layer 120, localized regions of relatively high and low resistance may represent coded information stored in the material stack 105 (i.e., data or encoded data). The individual storage regions may be similar in size and shape to the major and minor diameters of the electron stream 145. The quality of the data interrogation of the material stack 105 (i.e., reading the information on the material stack 105) may be degraded if either of the major diameter or the minor diameter of the electron stream 145 is larger than the individual storage region being interrogated by the electron stream.

An individual data storage mark may be either a single spot similar in diameter to the electron stream 145 or an elongated mark representing a sequence of encoded bits. The elongated mark may be similar to the electron stream 145 in width but significantly longer than either the major or minor diameters of the electron stream 145. The elongated mark may be created by the continuous application of the "write" current density in the electron stream 145 or by rapidly modulating the electron stream's 145 current density creating a overlapping succession of adjacent marks. As a result, an interrogation electron stream having a diameter smaller than the major or minor diameters of data marks on the variable resistive layer 120 may provide substantial improvement in signal-to-noise (SNR) levels and data mark detection, spot-mark edge, resolution.

The transformer 150 may be configured to detect a difference in current as the electron stream 145 is injected into the material stack 105 (i.e., a differential current transformer). while providing a high common-mode noise rejection of noise from the anode power supply 160. In particular, the transformer 150 may be, but is not limited to, a transformer with three windings, generally shown as a first winding 182, a second winding 184, and a third winding 186.

The polarity dots associated with the first and second windings 182, 184 should counter each other. That is, the first and second windings 182, 184 may be configured in a differential configuration where equal current variations in both windings generate a magnetic field with a vector sum of zero. A difference in the current flowing through the first and second windings 182, 184 may generate a non-zero vector sum, which in turn, is applied to an isolated winding such as the third winding 186. For example, the third winding 186 may be operatively coupled to an amplifying circuit 170 configured to process the output signals of the third winding 186 based on the magnetic fields generated by the first and second windings 182, 184. The output signals of the amplifying circuit 170 may be processed to determine the sequential series of states of the variable resistive layer 120 as persons of ordinary skill in the art of read-channel signal processing will readily recognize.

To optimize performance of the transformer 150, the first and second windings 182, 184 may be configured to have an identical number of turns. Accordingly, maximum anode voltage noise rejection may be achieved at the conductive contact layer 110 and the substrate layer 140 (i.e., maximum common mode noise rejection). As a result, noise from the anode power supply 160 will be rejected and not coupled into the third transformer winding 186.

Although, the transformer 150 is particularly well suited for use with the material system 100 disclosed herein, persons of ordinary skill in the art will readily appreciate that the transformer 150 is in no way limited to such a configuration. The transformer 150 may be configured with only two windings. For example, the first and second windings 182, 184 (i.e., the two independent anode bias differential windings) may be substituted with a single center-tapped winding (shown in FIG. 4). That is, the transformer 150 is a center-tapped transformer with the first and second windings 182, 184 serially coupled to each other to form a single winding with the center tap connected to anode power supply 160. To optimize noise cancellation and electron stream distribution, the center-tap winding may be attached slightly off-center to vary the winding ratios. The third winding 186 (i.e., the isolated winding) may remain floating and separate.

Figure 2:
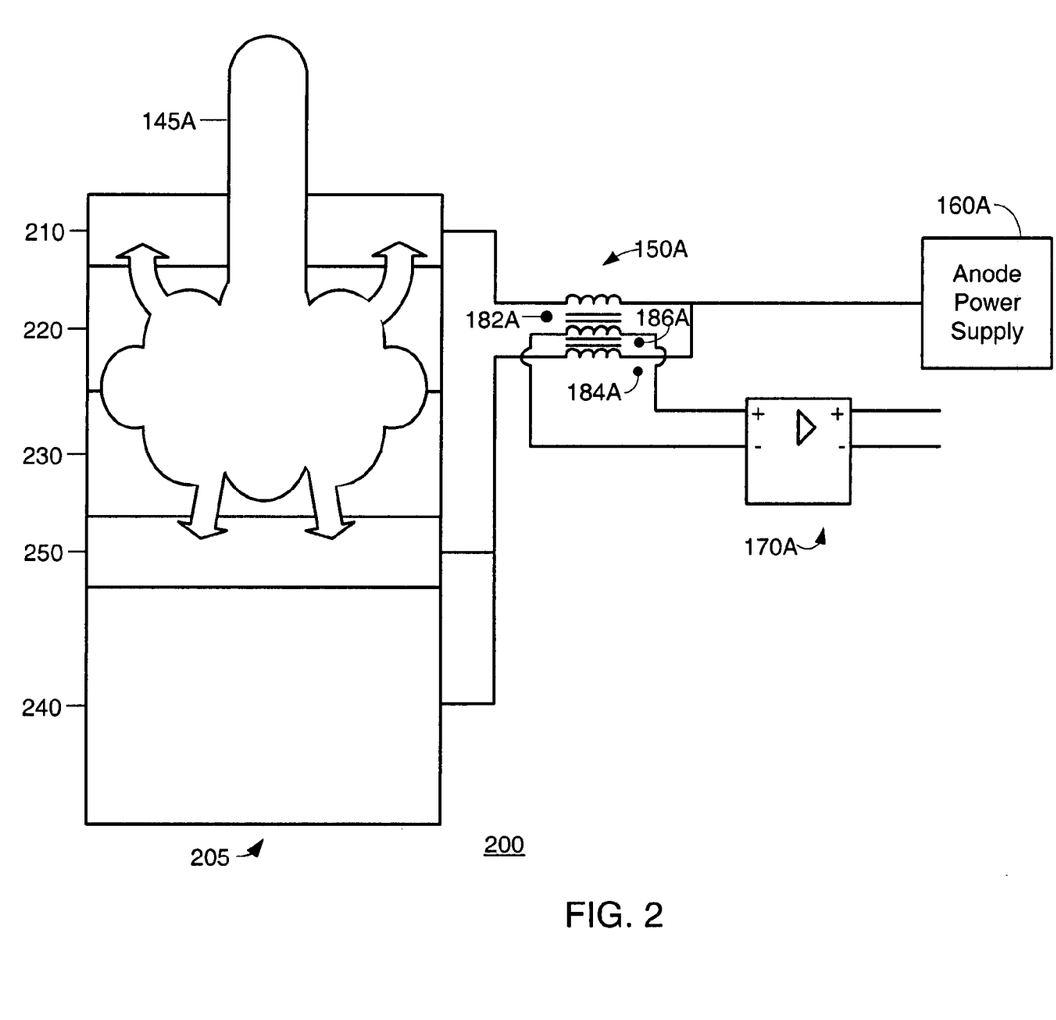

As noted above, the substrate layer 140 may serve as a second conductive contact layer if the substrate layer 140 is made of a conductive material. Alternatively, the second conductive contact layer may be a separate layer. Referring to FIG. 2, the material stack 205 may include a first conductive contact layer 210, a variable resistive layer 220, a fixed resistive layer 230, a substrate layer 240, and a second conductive contact layer 250. Similar to the material stack 105 shown in FIG. 1, the first conductive contact layer 210 of the material stack 205 may overlie the variable resistive layer 220, which in turn, may overlie the fixed resistive layer 230. Underlying the fixed resistive layer 230 is the second conductive contact layer 250, which in turn, may overlie the substrate layer 240. That is, the second conductive contact layer 250 may be sandwiched between the fixed resistive layer 230 and the substrate layer 240. In this configuration, the substrate layer 240 may be used as a dielectric layer to isolate the contact layer 250 from any other materials.

The transformer 150A may be operatively coupled to the first conductive contact layer 210 and the second conductive contact layer 250 via the first and second windings 182A, 184A, respectively. The sheet resistance of the second conductive contact layer 250 should be significantly lower than the sheet resistance of the variable resistive layer 220 in a low resistance state and the fixed resistive layer 230 to optimize areal density performance. Accordingly, the electrons injected through the first conductive contact layer 210 and scattered in the material stack 205 will distribute and flow toward both conductive contact layers 210 and 250 with an increased number of electrons flowing towards the second conductive contact layer 250 when the variable resistive layer 220 is in a high resistance state.

The transformer 150A detects a difference in current between the first conductive contact layer 210 and the second conductive contact layer 250 to generate a magnetic field via the first and second windings 182A, 184A. In response to the difference in these magnetic fields, the third winding 186A generates an output signal for recovery of the information stored on the material stack 205 at the location illuminated by the electron stream 145A. The recovered signal may be amplified-and detected in the circuit 170A. If the variable resistive layer 220 scanned by the streaming electron-beam 145A is in a steady state (i.e., the variable resistive layer 220 is not shifting from a low resistance state to a high resistance state or vice versa) then the transformer 150A will not detect a change in current between the first conductive contact layer 210 and the second conductive contact layer 250 so that the third winding 186A will not generate an output signal. In this respect, the transformer acts as a differentiation circuit, producing an output at the transitions between the resistive changes in the variable resistive layer 220.

Figure 3:
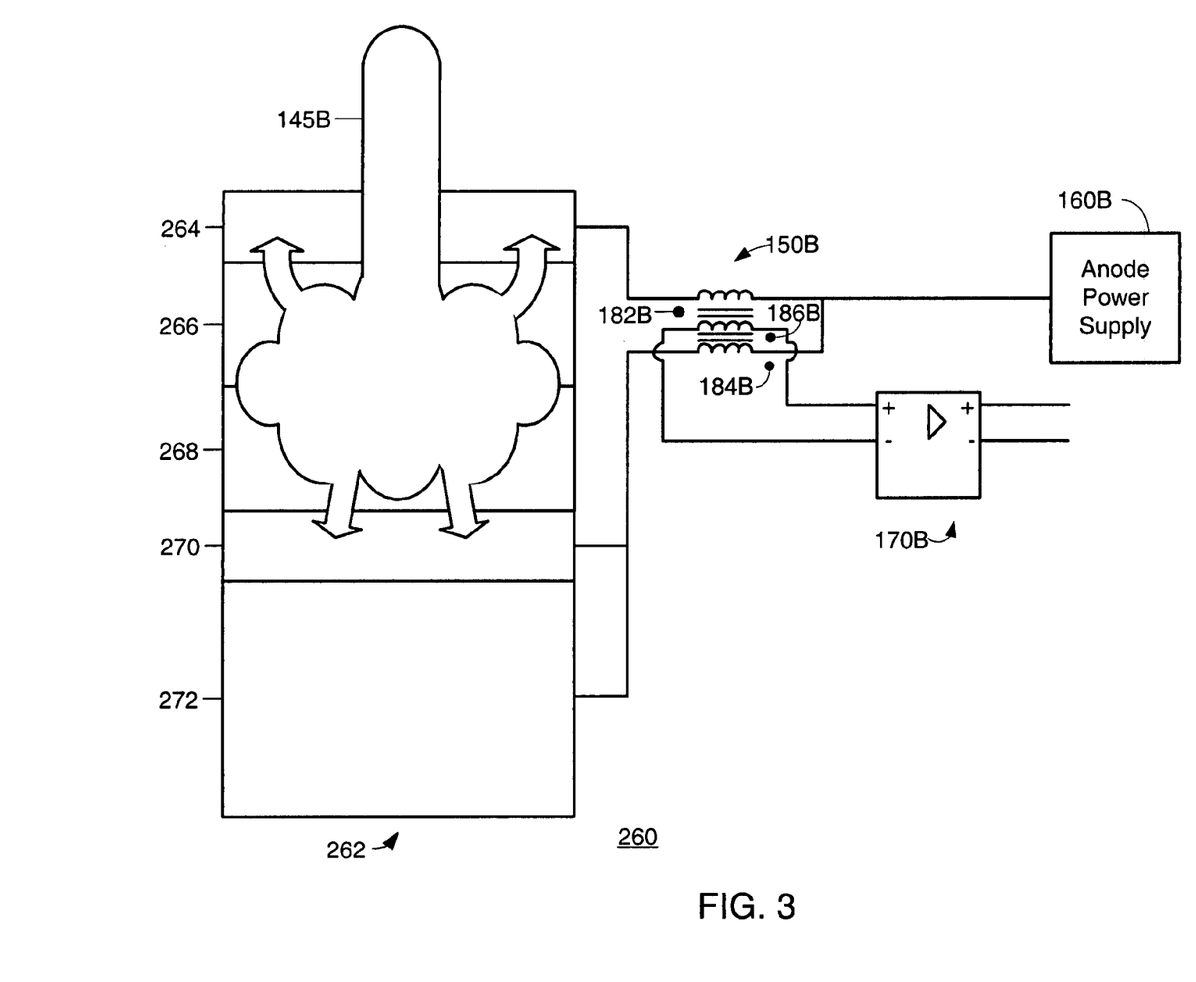

FIG. 3 illustrates a material stack 262 similar to the material stack 205 from FIG. 2, except that the material stack 262 illustrates the reversal of the variable resistive layer and the fixed resistive layer. The material stack 262 includes a first conductive contact layer 264, a fixed resistive layer 266, a variable resistive layer 268, a second conductive contact layer 270, and a substrate layer 272. Similar to the material stack 205 shown in FIG. 2, the first conductive contact layer 264 of the material stack 262 may overlie the fixed resistive layer 266, which in turn, may overlie the variable resistive layer 268. Underlying the variable resistive layer 268 is the second conductive contact layer 270, which in turn, may overlie the substrate layer 272.

As with the system 200 from FIG. 2, the transformer 150B may be operatively coupled to the first conductive contact layer 264 and the second conductive contact layer 270 via the first and second windings 182B, 184B, respectively. The system 260 may utilize a high energy electron stream 145B having, for example, 3,000 to 7,000 volts, so that a significant portion of the electron stream 145B electrons penetrate through the first conductive layer 264 and the fixed resistive layer 266 into the variable resistive layer 268 and are then scattered in the material stack 260 and distribute and flow toward both conductive contact layers 264 and 270.

The transformer 150B detects a difference in current between the first conductive contact layer 264 and the second conductive contact layer 270 to generate a magnetic field via the first and second windings 182B, 184B. In response to the difference in these magnetic fields, the third winding 186B generates an output signal for recovery of the information stored on the material stack 260 at the location illuminated by the electron stream 145B. The recovered signal may be amplified-and detected in the circuit 150B.

Figure 4:
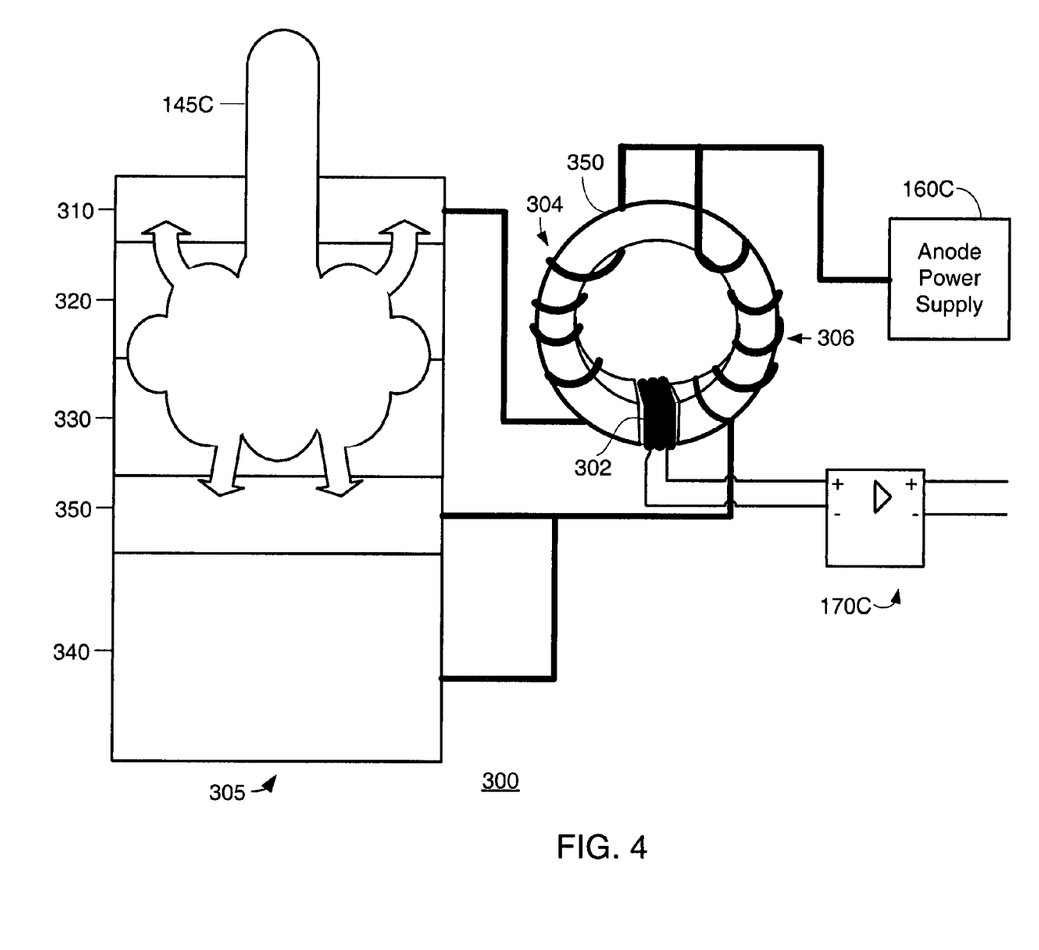
FIG. 4 is a block diagram of a differential sensing winding of a transformer having a differential magnetic Hall effect or magneto-resistive sensor.

FIG. 4 is block diagram representation of a system 300 for determining a state of a variable resistive layer in a material stack using a differential sensing winding of a transformer having a differential magnetic Hall effect or magneto-resistive sensor. The system 300 of FIG. 4 is similar to the system illustrated in FIG. 2, however the transformer winding 186A from FIG. 2 is replaced by a Hall effect or magneto-resistive sensor 302 configured to detect a difference between magnetic vectors generated by current flows in transformer winding 304 from the first conductive layer 310 and the current flows in transformer winding 306 from the second, substrate conductive layer 340/350. The transformer 350 replaces the third winding 186A from FIG. 2 with the magnetic vector sensor 302. This magnetic vector sensor 302 may be of one of the following types but is not limited to, a Hall effect sensor, magneto-resistive senor, giant-magneto-resistive sensor, a colossal-magneto-resistive sensor, a ballistic magneto-resistive sensor, and a tunneling-magneto-resistive sensor.

Still referring to FIG. 4, the material stack 305 may include a first conductive contact layer 310, a variable resistive layer 320, a fixed resistive layer 330, a substrate layer 340, and a second conductive contact layer 350. Similar to the material stack 205 shown in FIG. 2, the first conductive contact layer 310 of the material stack 305 may overlie the variable resistive layer 320, which in turn, may overlie the fixed resistive layer 330. Underlying the fixed resistive layer 330 is the second conductive contact layer 350, which in turn, may overlie the substrate layer 340. That is, the second conductive contact layer 350 may be sandwiched between the fixed resistive layer 330 and the substrate layer 340.

As previously mentioned, the transformer 350 may be operatively coupled to the first conductive contact layer 310 and the second conductive contact layer 350 via the first and second windings 304 and 306, respectively. The sheet resistance of the second conductive contact layer 350 should be significantly lower than the sheet resistance of the variable resistive layer 320 in a low resistance state and the fixed resistive layer 330 to optimize areal density performance. Accordingly, the electrons injected through the first conductive contact layer 310 and scattered in the material stack 305 will distribute and flow toward both conductive contact layers 310 and 350 with an increased number of electrons flowing towards the second conductive contact layer 350 when the variable resistive layer 320 is in a high resistance state.

The transformer 350 comprises a magnetic pole configuration with the first winding 304 and the second winding 306 wrapped around the ring of magnetic material and serially coupled to each other to form a single winding with the center tap connected to the anode power supply 160C. As known to those of ordinary skill in the art, the closed form, ring-shaped magnetic material may alternatively be formed in the shape of a square, a rectangle, or any other suitable shape. In operation, the first and second windings 304, 306 detect a difference in current between the first conductive contact layer 310 and the second conductive contact layer 350. When the currents in the first and second windings 304, 306 are equal to each other in opposite directions, the net result is that there is no magnetic flux in the loop, because the opposing fluxes cancel each other. In other words, the net moment of magnetic flux in the loop is zero. This is true regardless of where the loop is broken.

In response to the difference in the magnetic fluxes, the sensor 302 generates an output signal for recovery of the information stored on the material stack 305 at the location illuminated by the electron stream 145C. The recovered signal may be amplified-and detected in the circuit 170C. If the variable resistive layer 320 scanned by the streaming electron-beam 145C is in a steady state (i.e., the variable resistive layer 320 is not shifting from a low resistance state to a high resistance state or vice versa) then the transformer 350 will not detect a change in current between the first conductive contact layer 310 and the second conductive contact layer 350 so that the sensor 302 will not generate a varying output signal. In this respect, the transformer acts as a differentiation circuit, producing an output at the transitions between the resistive changes in the variable resistive layer 320. Lastly, it should be noted that many other types of sensors could replace the sensor 302.

Figure 5:
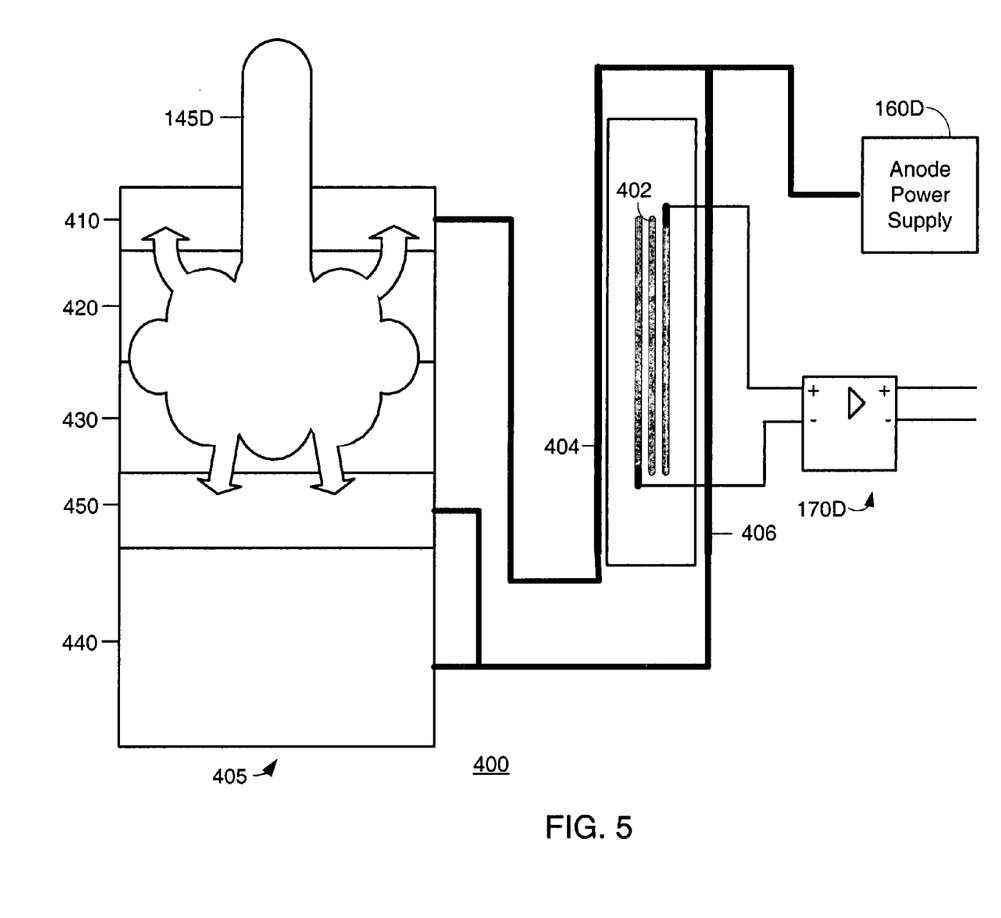
FIG. 5 is An exemplary diagram of an alternative embodiment of FIG. 4 where the multi-turn transformer core is replaced by direct inductive sensing of the current-proportional magnetic field that surrounds the single wires connecting the anode voltage to the material stack.

FIG. 5 illustrates a block diagram representation of an exemplary system 400 for determining a state of a variable resistive layer in a material stack using an alternative embodiment of a sensor having an implied-pole configuration. The system 400 of FIG. 5 is similar to the system illustrated in FIG. 2, however the transformer winding 186A from FIG. 2 is replaced by the implied-pole sensor 402 configured to detect a difference between magnetic fields generated by current flows in the wire 404 from the first conductive layer 410 and the current flows the wire 406 from the second, substrate conductive layer 440/450. The third winding 186A from FIG. 2 is replaced with the implied pole sensor 402. This implied pole sensor 402 may be one of many types of sensors known to those of ordinary skill in the art including magneto-resistive sensors.

Still referring to FIG. 5, the material stack 405 may include a first conductive contact layer 410, a variable resistive layer 420, a fixed resistive layer 430, a substrate layer 440, and a second conductive contact layer 450. Similar to the material stack 205 shown in FIG. 2, the first conductive contact layer 410 of the material stack 405 may overlie the variable resistive layer 420, which in turn, may overlie the fixed resistive layer 430. Underlying the fixed resistive layer 430 is the second conductive contact layer 450, which in turn, may overlie the substrate layer 440. That is, the second conductive contact layer 450 may be sandwiched between the fixed resistive layer 430 and the substrate layer 440.

As previously mentioned, the wire 404 may be operatively coupled to the first conductive contact layer 410 and the wire 406 may be operatively coupled to the second conductive contact layer 450. The sheet resistance of the second conductive contact layer 450 should be significantly lower than the sheet resistance of the variable resistive layer 420 in a low resistance state and the fixed resistive layer 430 to optimize areal density performance. Accordingly, the electrons injected through the first conductive contact layer 410 and scattered in the material stack 405 will distribute and flow toward both conductive contact layers 410 and 450 with an increased number of electrons flowing towards the second conductive contact layer 450 when the variable resistive layer 420 is in a high resistance state.

In operation, the sensor 402 detects a difference in current between the first conductive contact layer 410 and the second conductive contact layer 450 by sensing the magnetic fields created around each wire 404, 406 according to the right-hand-rule. When the currents in the wires 404, 406 are equal to each other in opposite directions, the net result is that there is no magnetic field at the sensor 402, because the opposing fields cancel each other. In other words, the net moment of magnetic flux at the sensor 402 is zero.

In response to the difference in the magnetic fields, the sensor 402 generates an output signal for recovery of the information stored on the material stack 405 at the location illuminated by the electron stream 145D. The recovered signal may be amplified-and detected in the circuit 170D. If the variable resistive layer 420 scanned by the streaming electron-beam 145C is in a steady state (i.e., the variable resistive layer 420 is not shifting from a low resistance state to a high resistance state or vice versa) then the sensor 402 will not detect a change in current between the first conductive contact layer 410 and the second conductive contact layer 450 so that the sensor 402 will not generate a varying output signal. In this respect, the implied-pole transformer acts as a differentiation circuit, producing an output at the transitions between the resistive changes in the variable resistive layer 420.

Figure 6A:
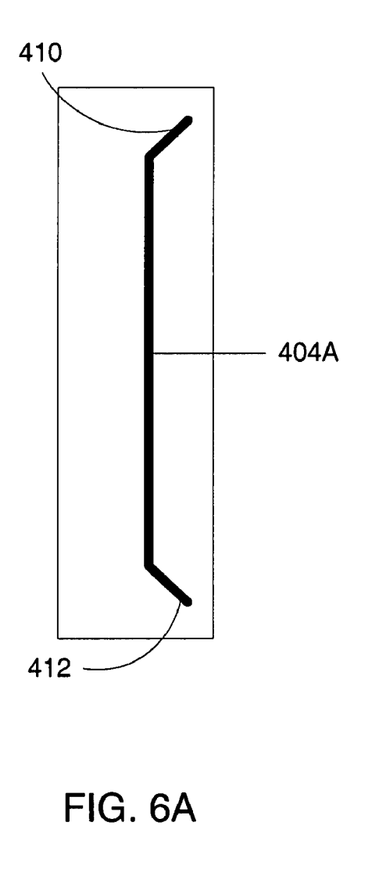
FIGS. 6A and 6B illustrate a bottom view and a top view, respectively, of an implied-pole sensor of FIG. 5.
Figure 6B:
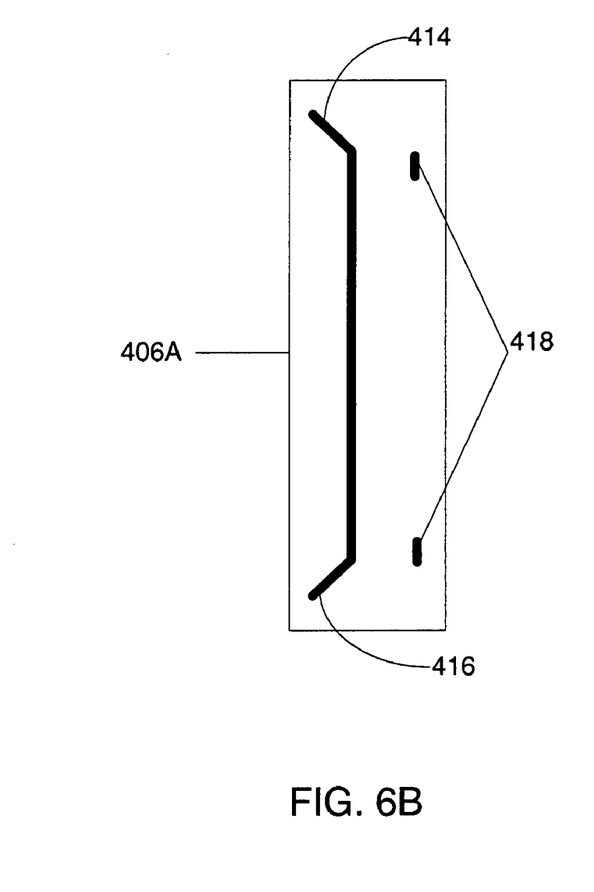

FIGS. 6A and 6B illustrate a bottom view and a top view of the implied-pole sensor 402 of FIG. 5. In FIG. 6A, the wire 404A includes an anode contact 410 and a first conductive contact 412. In FIG. 6B, the wire 406A includes an anode contact 414 and a second conductive contact 416. FIG. 6B also illustrates a pair of sensor contacts 418.

Figure 7:
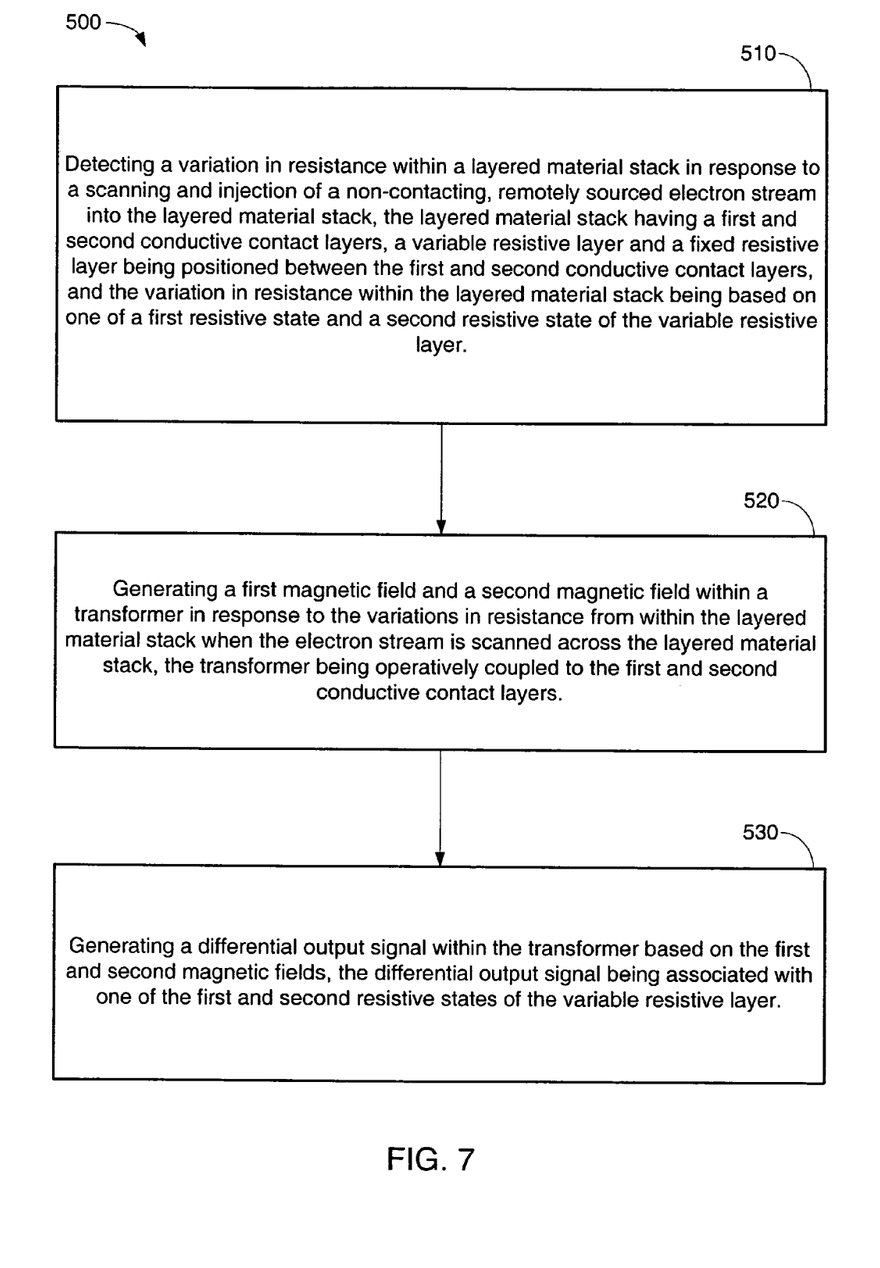
FIG. 7 is a flow diagram illustrating a method for determining a state of a variable resistive layer in a material stack.

One possible implementation of the systems 100, 200, 260, 300, and 400 is illustrated in FIG. 7. Although a particular order of steps is illustrated in FIG. 7, persons of ordinary skill in the art will appreciate that these steps can be performed in other temporal sequences. The flow chart 400 is merely provided as an example of one way to operate the systems 100, 200, 260 or 300 to determine a state of a variable resistive layer (e.g., shown as 120, 220, 268 and 320 in FIGS. 1-4, respectively) in a material stack of a data storage medium.

The flow chart 500 begins at step 510, wherein an energy source injects an electron stream into a material stack to scan for information stored in the data storage medium. As noted above, the material stack generally includes a first conductive contact layer, a variable resistive layer, a fixed variable layer, and a second conductive contact layer. The first conductive contact layer may overlie the variable resistive layer, which in turn, may overlie the fixed resistive layer. Alternatively, the fixed resistive layer may be a portion of the variable resistive layer. That is, the variable resistive layer may be a phase-change material, and the fixed resistive layer may be a portion of the variable resistive layer with a fixed phase (i.e., a portion that does not change in phase during the data write operations). Another alternative would include switching the order of the variable resistive layer and the fixed resistive layer within the material stack. The electron stream from the energy source may engage the variable resistive layer through the first conductive contact layer. Electrons of the electron streams may scatter within all layers including the variable resistive layer.

At step 520, a transformer senses the distributions of electrons in response to the injection of the electron stream into the material stack. The transformer may include a first winding, a second winding, and a third winding. The third winding senses the difference in magnetic fields generated by the first and second windings. In particular, the transformer may be operatively coupled to the first and second conductive contact layers via the first and second windings, respectively. Based on the state of the variable resistive layer, the distribution ratios of the electrons will vary between the first conductive contact layer and the second conductive contact layer. For example, more of the electrons scattered within the variable resistive layer may flow toward the first conductive contact layer if the variable resistive layer is in a low resistance state (i.e., zeroes).

In contrast, more of the electrons scattered within the variable resistive layer will flow toward the second conductive layer if the variable resistive layer is in a high resistance state (i.e., ones). Accordingly, the transformer may detect a difference in current between the first and second conductive contact layers to generate a magnetic field.

In response to the magnetic field, the transformer at step 530 will generate an output signal for signal processing as persons of ordinary skill in the art of data recovery will readily contrive means and methods to recover the information stored in the material stack.

Many changes and modifications to the embodiments described herein could be made. The scope of some changes is discussed above. The scope of others will become apparent from the appended claims.

What is claimed is:

1. A method comprising:
   detecting a variation in resistance within a layered material stack in response to a scanning and injection of a non-contacting, remotely sourced electron stream into the layered material stack, the layered material stack having a first conductive contact layer, a second conductive contact layer, a variable resistive layer and a fixed resistive layer being positioned between the first and second conductive contact layers, and the variation in resistance within the layered material stack being based on one of a first resistive state and a second resistive state of the variable resistive layer;
   wherein detecting the variation in resistance within the layered material stack includes:
      detecting the first resistive state of the variable resistive layer in response to a distribution ratio of electrons from the electron stream flowing toward the first conductive contact layer; and
      detecting the second resistive state of the variable resistive layer in response to a distribution ratio of electrons from the electron stream flowing toward the second conductive contact layer;
   generating a first magnetic field and a second magnetic field within a transformer in response to the variations in resistance from within the layered material stack when the electron stream is scanned across the layered material stack, the transformer being operatively coupled to the first and second conductive contact layers; and
   generating a differential output signal within the transformer based on the first and second magnetic fields, the differential output signal being associated with one of the first and second resistive states of the variable resistive layer.

2. The method of claim 1, wherein detecting the variation in resistance within the layered material stack comprises detecting a difference in current distribution within the layered material stack in response to the scanning and injection of the electron stream into the layered material stack, the layered material stack having a substrate layer and wherein the second conductive contact layer is a portion of the substrate layer.

3. The method of claim 1, comprising detecting a third resistive state of the variable resistive layer.

4. The method of claim 1, wherein generating the first and second magnetic fields within the transformer comprises generating a third magnetic field within the transformer, the transformer having an identical number of turns.

5. The method of claim 1, wherein detecting the variation in resistance within the layered material stack comprises scanning and injecting the electron stream into the layered material stack, the layers of the layered material stack having layers of materials that are significantly larger in area than the cross sectional area of the electron stream.

6. The method of claim 1, wherein generating the first magnetic field comprises passing a first current through a first wire that is operatively coupled to the first conductive contact layer;
   and wherein generating the second magnetic field comprises passing a second current through a second wire that is operatively coupled to the second conductive contact layer; and
   wherein generating the differential output signal comprises positioning a sensor between the first and second wires to detect a vector sum of the first and second magnetic fields.

7. The method of claim 1, wherein generating the first and second magnetic fields within the transformer comprises generating a net magnetic field within a center-tapped transformer.

8. The method of claim 1, wherein the layered material stack comprises the variable resistive layer underlying the first conductive contact layer, the fixed resistive layer underlying the variable resistive layer, and the second conductive contact layer underlying the fixed resistive layer.

9. The method of claim 1, wherein the layered material stack further comprises a third resistive layer located between the first and second conductive contact layers.

10. The method of claim 9, wherein the third resistive layer is a second variable resistive layer.

11. The method of claim 1, comprising detecting a variation in resistance within the layered material stack in response to a scanning and injection of a non-contacting, remotely sourced electron stream into the layered material stack.

12. A method comprising:
   injecting a non-contacting, remotely sourced electron stream from an energy source into a material stack of data storage medium, the material stack having a first and second conductive contact layers, a variable resistive information storage layer, a fixed resistive layer, and a third resistive layer being positioned between the first and second conductive contact layers, the variable resistive information storage layer having a different resistance to each of the first and second conductive layers, the electron stream engaging the variable resistive layer through the first conductive contact layer, and the variable resistive layer having a plurality of resistive states;
   detecting a difference in current distributed to the first and second conductive contact layers via a sensor in response to the injection of the electron stream into the material stack, the sensor having a first winding operatively coupled to the first conductive contact layer and a second winding operatively coupled to the second conductive contact layer, the sensor configured to generate an output signal proportional to the difference in the plurality of resistive states of the variable resistive layer, based on the difference in current between the first and second conductive contact layers.

13. The method of claim 12, wherein injecting the electron stream into the material stack comprises injecting the electron stream into the material stack having a substrate layer, and wherein the second conductive contact layer is a portion of the substrate layer.

14. The method of claim 12, wherein detecting the difference in current distributed to the first and second conductive contact layers via the sensor comprises:
   detecting a first resistive state of the variable resistive layer in response to a distribution of electrons of the electron stream flowing toward the first conductive contact layer; and
   detecting a second resistive state of the variable resistive layer in response to a distribution of electrons of the electron stream flowing toward the second conductive contact layer.

15. The method of claim 12, wherein the layered material stack comprises the variable resistive layer underlying the first conductive contact layer, the fixed resistive layer underlying the variable resistive layer, and the second conductive contact layer underlying the fixed resistive layer.

16. The method of claim 12, wherein the layered material stack comprises the fixed resistive layer underlying the first conductive contact layer, the variable resistive layer underlying the fixed resistive layer, and the second conductive contact layer underlying the variable resistive layer.

17. The method of claim 12, wherein the sensor is a magneto-resistive sensor.

18. The method of claim 12, wherein the sensor is a transformer and further comprises a third winding to generate the output signal.

19. The method of claim 18, wherein detecting the difference in current distributed to the material stack comprises detecting the difference in current distributed to the material stack via a transformer having a first winding and a second winding with an identical number of turns relative to each other.

20. A system comprising:
   an energy source configured to inject a non-contacting, remote electron stream into a material stack of a data storage medium, the material stack having a first and second conductive contact layers, a variable resistive information storage layer and one or more fixed resistive layers, the variable resistive information storage layer and the one or more fixed resistive layers being positioned between the first and second conductive contact layers, the variable resistive information storage layer having a different fixed resistance to each of the first and second conductive contact layers, and the electron stream engaging the variable resistive layer through the first conductive contact layer;
   a power supply configured to provide an anode voltage to the first and second conductive contact layers of the material stack; and
   a transformer having a first winding operatively coupled to the first conductive contact layer to provide the anode voltage from the power supply to the first conductive contact layer, a second winding operatively coupled to the second conductive contact layer to provide the anode voltage from the power supply to the second conductive contact layer, and a third winding configured to output a signal associated with one of a first resistive state and a second resistive state of the variable resistive layer in response to the difference between a first magnetic field and a second magnetic field generated by the first and second windings, the first and second windings being in a differential configuration relative to each other to generate the first and second magnetic fields based on a difference in current, and to detect a difference in current between the first and second conductive contact layers in response to the injection and distribution of the electron stream into the material stack.

21. The system of claim 20, wherein the first and second windings comprise an identical number of turns.

22. The system of claim 20, wherein the second conductive contact layer is one of a substrate layer and a portion of the substrate layer.

23. The system of claim 20, wherein the transformer is configured to detect the first resistive state of the variable resistive information storage layer in response to a distribution of electrons of the electron stream flowing toward the first conductive contact layer and to detect the second resistive state of the variable resistive information storage layer in response to a distribution of electrons of the electron stream flowing toward the second conductive contact layer.

24. The system of claim 20, comprising configuring the third winding to output another signal associated with a third resistive state of the variable resistive information storage layer.

25. The method of claim 20, wherein the material stack comprises one of the one or more fixed resistive layers underlying the first conductive contact layer, the variable resistive information storage layer underlying the one or more fixed resistive layers, and the second conductive contact layer underlying the variable resistive information storage layer.

26. The method of claim 20, wherein the material stack comprises two fixed resistive layers located between the first and second conductive contact layers.

27. A method comprising:
   detecting a number of variations in resistance within a layered material stack in response to a scanning and injection of an electron stream into the layered material stack, the layered material stack having a first conductive contact layer, a fixed resistive layer underlying the first conductive contact layer, a variable resistive layer underlying the fixed resistive layer, and a substrate layer underlying the variable resistive layer, and the number of variations in resistance within the layered material stack being based on at least one of a first resistive state and a second resistive state of the variable resistive layer;
   wherein detecting the number of variations in resistance within the layered material stack includes:
      detecting a first resistive state of the variable resistive layer in response to a distribution ratio of electrons from the electron stream flowing toward the first conductive contact layer; and
      detecting a second resistive state of the variable resistive layer in response to a distribution ratio of electrons from the electron stream flowing toward the substrate layer;
   generating a first magnetic field and a second magnetic field within a transformer in response to the number of variations in resistance from within the layered material stack when the electron stream is scanned across the layered material stack, the transformer being operatively coupled to the first conductive contact layer and the substrate layer; and generating a differential output signal within the transformer based on a vector sum of the first and second magnetic fields, the differential output signal being associated with one of a number of resistive states of the variable resistive layer.

28. The method of claim 27, wherein detecting the number of variations in resistance within the layered material stack comprises scanning and injecting the electron stream into the layered material stack, the layers of the layered material stack having layers of materials that are significantly larger in area than the cross sectional area of the electron stream.

* * * * *